United States Patent
Tsai et al.

(10) Patent No.: US 7,807,558 B2
(45) Date of Patent: Oct. 5, 2010

(54) METHOD OF FABRICATING A SEMICONDUCTOR DEVICE

(75) Inventors: Tzu-Ching Tsai, Taipei (TW); Tse-Yao Huang, Taipei (TW); Yi-Nan Chen, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 272 days.

(21) Appl. No.: 11/933,732

(22) Filed: Nov. 1, 2007

(65) Prior Publication Data

US 2009/0011587 A1    Jan. 8, 2009

(30) Foreign Application Priority Data

Jul. 2, 2007    (TW) ................. 96123954 A

(51) Int. Cl.
*H01L 21/3205* (2006.01)
*H01L 21/4763* (2006.01)

(52) U.S. Cl. ............... 438/592; 438/595; 257/E21.176; 257/E21.177

(58) Field of Classification Search ................. 438/592, 438/585, 197, 595, 265, 297, 478, 689; 257/E21.176, 257/E21.177, E21.178, E21.179, E21.18

See application file for complete search history.

(56) References Cited

U.S. PATENT DOCUMENTS

| | | | |
|---|---|---|---|
| 2004/0126937 A1* | 7/2004 | Gilton et al. | 438/142 |
| 2004/0129361 A1* | 7/2004 | Chen et al. | 156/58 |
| 2007/0048976 A1* | 3/2007 | Raghu | 438/478 |

* cited by examiner

*Primary Examiner*—Walter L Lindsay, Jr.

(57) ABSTRACT

A method of fabricating a semiconductor device is provided. The method of fabricating the semiconductor device comprises providing a substrate. Next, an insulating layer, a conductive layer and a silicide layer are formed on the substrate in sequence. Next, a hard masking layer is formed on the silicide layer exposing a portion of the silicide layer. A first etching step is performed to remove the silicide layer and the underlying conductive layer which are not covered by the hard masking layer, thereby forming a gate stack. And next, a second etching step is performed to remove any remaining conductive layer not covered by the hard masking layer after the first etching step. The second etching step is performed with an etchant comprising ammonium hydroxide.

16 Claims, 3 Drawing Sheets

METHOD OF FABRICATING A SEMICONDUCTOR DEVICE

BACKGROUND OF THE INVENTION

1. Field of the Invention

The invention relates to a method of fabricating a semiconductor device, and more particularly, relates to a method of fabricating a gate stack of a semiconductor device.

2. Description of the Related Art

In recent years, semiconductor device fabricating technology has continually sought new ways to achieve high device performance, low cost, and great device densities. For example, in the case of a dynamic random access memory (DRAM), high device densities can be used for forming trench capacitor structures during DRAM fabrication. Additionally, while reducing device critical dimension (CD), word line (WL) or so-called gate conductor (GC) stacks of DRAM cells will also be shrunk.

Nevertheless, for conventional WL etching processes, precision is limited due to the uneven topography of the laminate layers for subsequent WL etching given the differentiated step height of the underlying shallow trench isolations (STI). Specifically, WL etched on uneven topography results in bridge problems with WL to WL shorting due to underetching and device leakage and failure problems with WL punch through due to over-etching. As a result, the conventional WL etching processes increases device defect density and unreliability.

Thus, a novel and reliable method of fabricating a gate stack of a semiconductor device for reducing WL to WL short and device leakage is needed.

BRIEF SUMMARY OF INVENTION

To solve the above-described problems, a method of fabricating a semiconductor device is provided. An exemplary embodiment of a method of fabricating a semiconductor device comprises providing a substrate. Next, an insulating layer, a conductive layer and a silicide layer are sequentially formed on top of the substrate. A patterned hard masking layer is next formed on the silicide layer exposing a portion of the silicide layer. A first etching step is performed to partially remove the silicide layer and the underlying conductive layer which are not covered by the hard masking layer, thereby forming a gate stack. And next, a second etching step is performed to remove residue of any remaining conductive layer not covered by the hard masking layer after the first etching step. The second etching step is performed with an etchant comprising ammonium hydroxide.

Another exemplary embodiment of a method of fabricating a semiconductor device comprises providing a substrate. Next, an insulating layer, a conductive layer and a silicide layer are sequentially formed on the substrate in sequence. Next, a patterned hard masking layer is formed on the silicide layer exposing a portion of the silicide layer. A first etching step is performed to partially remove the silicide layer and the underlying conductive layer which are not covered by the hard masking layer, thereby forming a gate stack. Next, a second etching step is performed to remove residue of the any remaining conductive layer not covered by the hard masking layer after the first etching step. The second etching step is performed with an etchant comprising ammonium hydroxide. And next, a third etching step is performed to remove a portion of the silicide layer of the gate stack so as to allow the silicide layer to have a neck after the second etching step.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1:
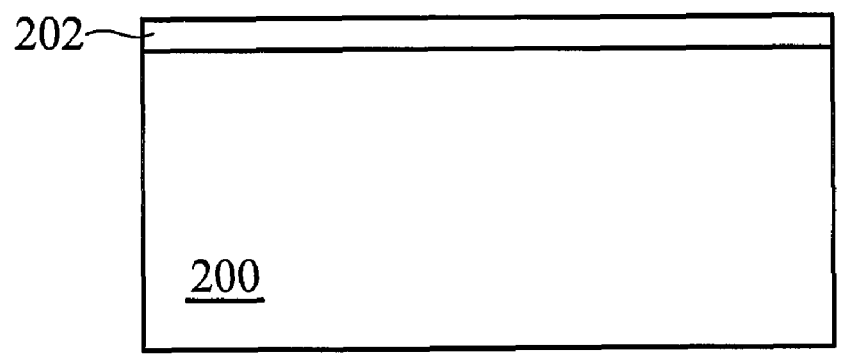
FIGS. 1 to 6 show cross sections of an exemplary embodiment of a process of fabricating a semiconductor device.

The following description is of the best-contemplated mode of carrying out the invention. This description is made for the purpose of illustrating the general principles of the invention and should not be taken in a limiting sense. The scope of the invention is best determined by reference to the appended claims.

FIGS. 1 to 6 show cross sections of an exemplary embodiment of a process of fabricating a semiconductor device. Wherever possible, the same reference numbers are used in the drawings and the descriptions to refer to the same or like parts.

FIGS. 1 to 6 are cross sections showing an exemplary embodiment of a method for fabricating a gate stack. Referring to FIG. 1, a substrate 200 is provided. The substrate 200 is preferably a silicon substrate. Also, the substrate 200 may comprise SiGe silicon on insulator (SOI), and other commonly used semiconductor substrates can be used. In one embodiment, a plurality of shallow trench isolations (STI) (not shown) is formed in the substrate 200 to isolate subsequent semiconductor devices. The shallow trench isolations (STI) may be formed by etching the substrate 200 to form recesses. Next, a dielectric material such as a high-density plasma oxide (HDP oxide) is filled in the recesses. A planarization process such as chemical mechanical polish (CMP) is performed to remove the excessive dielectric material on top of the substrate 200 to form STIs in the substrate 200. An insulating layer 202 is then formed on the substrate 200 by methods such as thermal oxidation, chemical vapor deposition (CVD), or atomic layer CVD (ALCVD). The insulating layer 202 may comprise oxide, nitride, oxynitride, oxycarbide or combinations thereof. The insulating layer 202 may also comprise high-dielectric constant (k) (k>8) dielectric materials such as aluminum oxide ($Al_2O_3$), hafnium oxide ($HfO_2$), hafnium oxynitride (HfON), hafnium silicate (HfSiO4), zirconium oxide ($ZrO_2$); zirconium oxynitride (ZrON, zirconium silicate ($ZrSiO_4$), yttrium oxide ($Y_2O_3$), lanthalum oxide ($La_2O_3$), cerium oxide ($CeO_2$), titanium oxide ($TiO_2$), tantalum oxide ($Ta_2O_5$) or combinations thereof. In one embodiment, the insulating layer 202 is used as a gate insulating layer of the semiconductor device.

Figure 2:
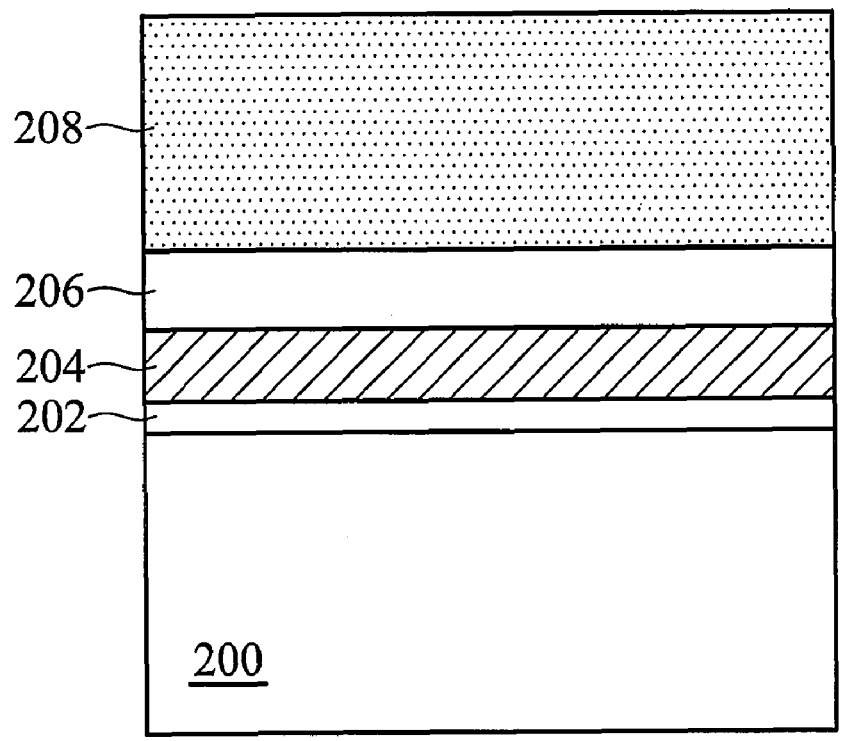

Referring to FIG. 2, a conductive layer 204 is next formed on the insulating layer 202 by thin film deposition processes such as CVD. The conductive layer 204 may comprise silicon or polysilicon. The conductive layer 204 is preferably doped to reduce sheet resistance. Alternatively, the conductive layer 204 may comprise amorphous silicon. Next, a silicide layer 206 is formed on the conductive layer 204 by methods such as thermal CVD with tungsten source material comprising $WF_6$ and silicon source material comprising $SiH_4$. In one embodiment, the silicide layer 206 may be a polycide layer formed of WSi. The silicide layer 206 can efficiently reduce contact resistance of the conductive layer 204. Next, a hard masking layer 208 is formed on the silicide layer 206. The hard masking layer 208 may comprise a nitride layer such as silicon nitride ($Si_3N_4$) formed by CVD. In one embodiment, the conductive layer 204 serves as a gate of the semiconductor device.

Figure 3:
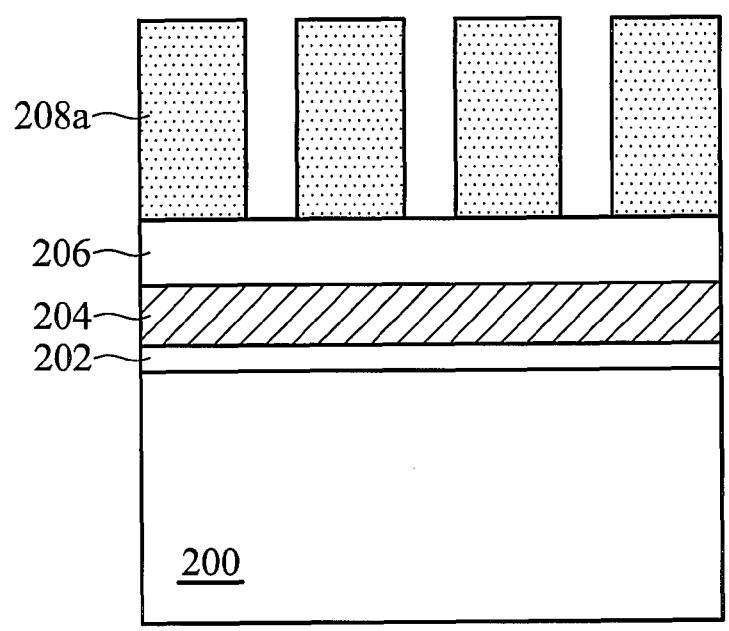

Referring to FIG. 3, a photoresist layer may cover the entire region (not shown). Next, a portion of the hard masking layer 208 is removed by photolithography and etching to form a patterned hard masking layer 208a. The photoresist layer is then removed.

Figure 4:
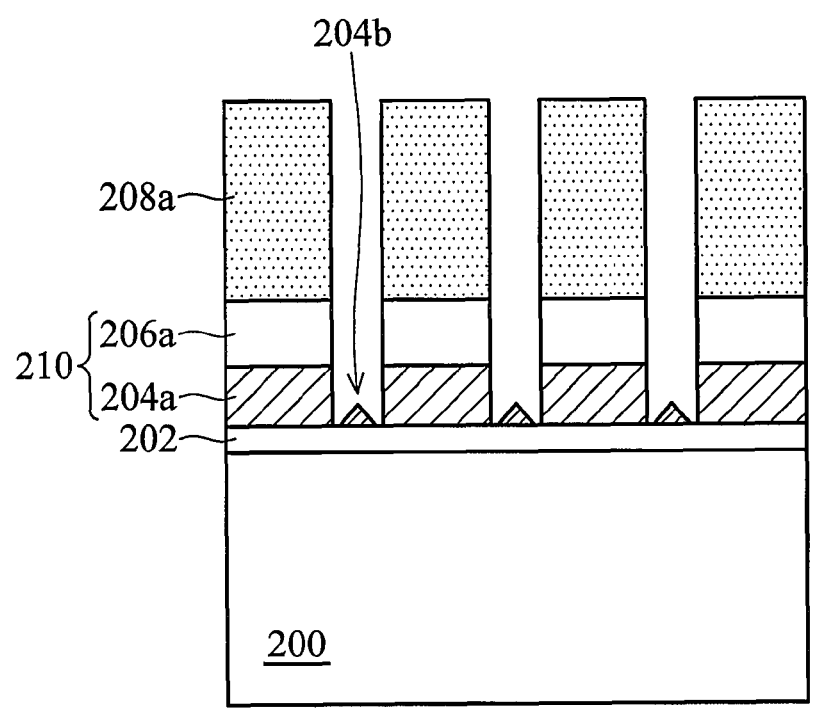

Referring to FIG. 4, a first etching step is performed to remove the silicide layer 206 and the underlying conductive layer 204 which are not covered by the patterned hard masking layer 208a, by dry etching with an etchant such as $Cl_2$, HCl, $SF_6$, $O_2$ or combinations thereof, thereby forming a gate stack 210. The gate stack 210 comprises a silicide layer 206a and a conductive layer 204a.

Figure 5:
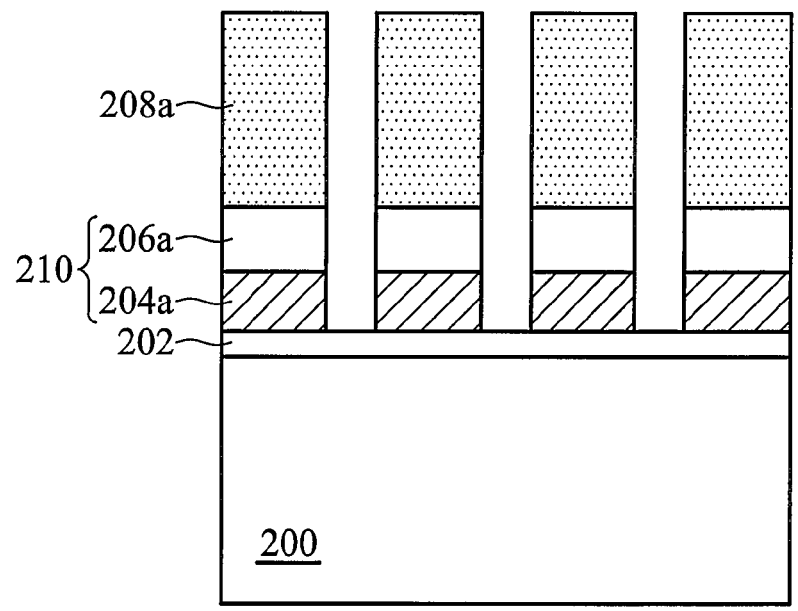

FIG. 5 illustrates a method of removing any remaining conductive layer 204b. A second etching step is performed to remove any remaining conductive layer 204b not covered by the patterned hard masking layer 208a after the first etching step, with an etchant comprising ammonium hydroxide ($NH_4OH$). In one embodiment, the second etching step is used to remove any remaining conductive layer 204b having a thickness between 5 Å to 100 Å at a temperature of around 25° C. to 30° C., preferably 25° C. The second etching step may comprise wet etching with an etchant comprising ammonium hydroxide ($NH_4OH$) dissolving in hydrogen oxide ($H_2O$). A volume ratio of $NH_4OH$ and $H_2O$ can be properly adjusted to achieve any profile required for the conductive layer 204a while removing the remaining conductive layer 204b. For example, the etchant comprising $NH_4OH$ and $H_2O$ preferably has a volume ratio of around 1:100 to 1:200, such that a conductive layer 204a critical dimension loss is controlled at less than 7%. Ammonium hydroxide ($NH_4OH$) of the etchant preferably comprises industrial $NH_4OH$ with a weight concentration of around 35 wt % to 45 wt %, preferably 40 wt %. The insulating layer 202 such as oxide is not damaged during the second etching step due to higher etching selectivity to oxide of $NH_4OH$.

Figure 6:
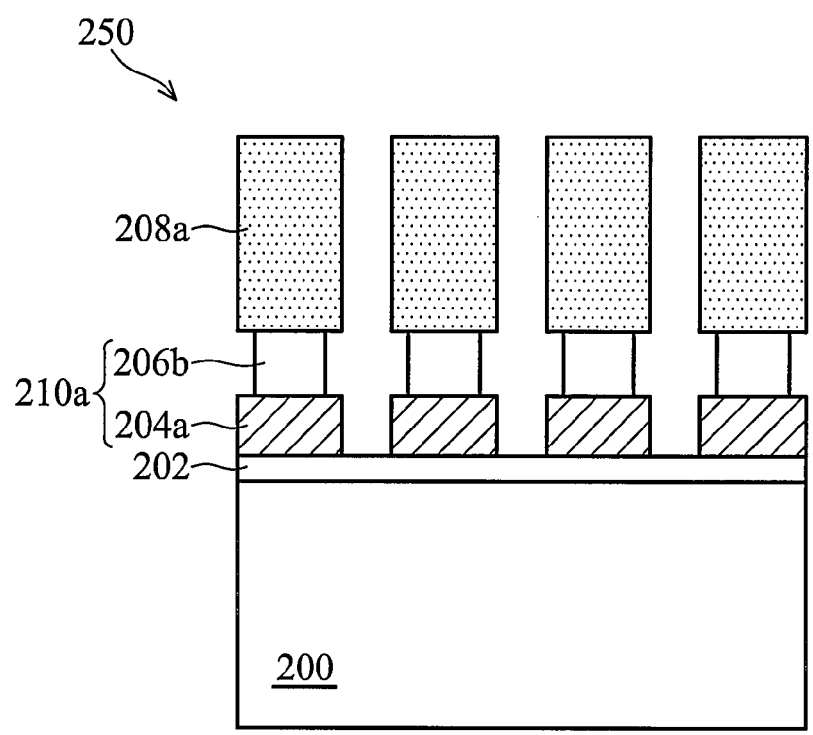

FIG. 6 illustrates a formation of a gate stack 210a. A third etching step is performed by removing a portion of the silicide layer 206a of the gate stack 210 to form a silicide layer 206b and a gate stack 210a. The third etching step may be a wet etching step using standard clean 1 (SC-1). SC-1 also referred to as ammonium hydrogen peroxide mixture (APM), comprises a solvent of ammonium hydroxide ($NH_4OH$)/hydrogen peroxide ($H_2O_2$)/hydrogen oxide ($H_2O$) with a volume ratio of about 1:1:5. After performing the third etching step, a sidewall of the silicide layer 206b is recessed to form a neck between the patterned hard masking layer 208a and the conductive layer 204a. Thus, the formation of a semiconductor device 250 is complete.

In the exemplary embodiment of the semiconductor device 250, the second etching step is performed with an etchant comprising ammonium hydroxide ($NH_4OH$) to remove any remaining conductive layer 204b not covered by the hard masking layer 208a after forming the gate stack 210a by the first etching step. The second etching step can be performed under required volume ratio of the etchant or required temperature to achieve a required profile of the conductive layer 204a while removing the remaining conductive layer 204b. In addition, the second etching step eliminates semiconductor device problems such as shorting, device leakage and failure, or more specifically, bridge problems due to gate under-etching or gate punch through due to gate over-etching, thereby decreasing device defect density and increasing device performance and reliability.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, comprising:
   providing a substrate;
   sequentially forming an insulating layer, a conductive layer and a silicide layer on top of the substrate;
   forming a patterned hard masking layer on the silicide layer to expose a portion of the silicide layer;
   performing a first etching to partially remove the silicide layer as well as the conductive layer underlying the removed silicide layer, thereby forming a gate stack;
   performing a second etching step to remove residue of any remaining conductive layer, with an etchant comprising ammonium hydroxide ($NH_4OH$); and
   performing a third etching step to remove a portion of the silicide layer of the gate stack so as to allow the silicide layer to have a neck after the second etching step.

2. The method of fabricating the semiconductor device as claimed in claim 1, wherein the third etching step is performed by a solvent of ammonium hydroxide ($NH_4OH$)/hydrogen peroxide ($H_2O_2$)/hydrogen oxide ($H_2O$) with a volume ratio of about 1:1:5.

3. The method of fabricating the semiconductor device as claimed in claim 1, wherein the second etching step is performed to remove the conductive layer having a thickness of between 5 Å to 100 Å.

4. The method of fabricating the semiconductor device as claimed in claim 1, wherein the second etching step is performed at a temperature of between 20° C. to 30° C.

5. The method of fabricating the semiconductor device as claimed in claim 1, wherein the etchant comprise ammonium hydroxide ($NH_4OH$) dissolved in hydrogen oxide ($H_2O$) with a volume ratio of between 1:100 to 1:200.

6. The method of fabricating the semiconductor device as claimed in claim 1, wherein the patterned hard masking layer comprises nitride.

7. The method of fabricating the semiconductor device as claimed in claim 1, wherein ammonium hydroxide ($NH_4OH$) of the etchant has a weight concentration of 35 wt % to 45 wt %.

8. A method of fabricating a semiconductor device, comprising:
   providing a substrate;
   sequentially forming an insulating layer, a conductive layer and a silicide layer on top of the substrate;
   forming a patterned hard masking layer on the silicide layer to expose a portion of the silicide layer;
   performing a first etching to partially remove the silicide layer as well as the conductive layer underlying the removed silicide layer, thereby forming a gate stack;
   performing a second etching step to remove residue of any remaining conductive layer free from being covered by the patterned hard masking layer, with an etchant comprising ammonium hydroxide ($NH_4OH$); and
   performing a third etching step to remove a portion of the silicide layer of the gate stack so as to allow the silicide layer to have a neck after the second etching step, wherein the third etching step is performed by a solvent of ammonium hydroxide (NH$_4$OH)/hydrogen peroxide (H$_2$O$_2$)/hydrogen oxide (H$_2$O) with a volume ratio of about 1:1:5.

9. The method of fabricating the semiconductor device as claimed in claim 8, wherein the second etching step is performed to remove the conductive layer having a thickness of between 5 Å to 100 Å.

10. The method of fabricating the semiconductor device as claimed in claim 8, wherein the second etching step is performed at a temperature of between 20° C. to 30° C.

11. The method of fabricating the semiconductor device as claimed in claim 8, wherein the etchant comprise ammonium hydroxide (NH$_4$OH) dissolved in hydrogen oxide (H$_2$O) with a volume ratio of between 1:100 to 1:200.

12. The method of fabricating the semiconductor device as claimed in claim 8, wherein the insulating layer comprises oxide.

13. The method of fabricating the semiconductor device as claimed in claim 8, wherein the conductive layer comprises silicon, polysilicon or amorphous silicon.

14. The method of fabricating the semiconductor device as claimed in claim 8, wherein the silicide layer comprises tungsten silicide (WSi).

15. The method of fabricating the semiconductor device as claimed in claim 8, wherein the patterned hard masking layer comprises nitride.

16. The method of fabricating the semiconductor device as claimed in claim 8, wherein ammonium hydroxide (NH$_4$OH) of the etchant has a weight concentration of 35 wt % to 45 wt %.

* * * * *